(12) United States Patent
Goyal et al.

(10) Patent No.: US 8,911,264 B2
(45) Date of Patent: Dec. 16, 2014

(54) CONNECTOR WITH INTEGRAL FUSE HOLDER

(71) Applicants: Rahul Natwar Goyal, Tyrone, GA (US); Surind Gulrajani, Thousand Oaks, CA (US)

(72) Inventors: Rahul Natwar Goyal, Tyrone, GA (US); Surind Gulrajani, Thousand Oaks, CA (US)

(73) Assignee: Cooper Technologies Company, Houston, TX (US)

( * ) Notice: Subject to any disclaimer, the term of this patent is extended or adjusted under 35 U.S.C. 154(b) by 123 days.

(21) Appl. No.: 13/657,488

(22) Filed: Oct. 22, 2012

(65) Prior Publication Data

US 2014/0113500 A1   Apr. 24, 2014

(51) Int. Cl.
*H01R 33/00* (2006.01)

(52) U.S. Cl.
USPC ............................................. 439/698

(58) Field of Classification Search
USPC ............ 439/698, 188, 620.28, 604, 936, 276, 439/320, 374
See application file for complete search history.

(56) References Cited

U.S. PATENT DOCUMENTS

| | | | |
|---|---|---|---|
| 4,448,476 A | 5/1984 | Perlman et al. | |
| 5,018,991 A | 5/1991 | Katz et al. | |
| 7,057,577 B1 * | 6/2006 | Willoughby et al. | 343/906 |
| 7,507,105 B1 | 3/2009 | Peters et al. | |
| 8,137,136 B1 * | 3/2012 | Bench | 439/604 |
| 2004/0183744 A1 * | 9/2004 | Raiman | 343/906 |
| 2004/0257191 A1 | 12/2004 | Muller | |
| 2011/0308833 A1 | 12/2011 | West | |
| 2012/0161919 A1 | 6/2012 | von zur Muehlen | |

OTHER PUBLICATIONS

Lumberg, Brochure, Connectivity Solutions for Photovoltaic Power Systems; Aug. 2010.
International Search Report and Written Opinion for PCT/US13/63652; mailed Mar. 25, 2014.

\* cited by examiner

*Primary Examiner* — Jean F Duverne
(74) *Attorney, Agent, or Firm* — King & Spalding LLP (57) ABSTRACT

A connector with an integral fuse holder is described herein. The connector can include a portion having a fuse receiver disposed within a cavity and coupled to an electrical connection feature. The connector can include an end coupled to the portion, where the end includes a wall that forms a cavity. The connector can further include a fuse assembly having a contact member, a fuse, a fuse holder, and a conductor receiver. The contact member can couple to the electrical connection feature. The fuse holder can include a first end that couples to a top end of the fuse and the contact member, and a second end that couples to a bottom end of the fuse. The conductor receiver can couple to the second end of the fuse holder and to the bottom end of the fuse. A receiving feature of the conductor receiver can couple to a conductor.

20 Claims, 3 Drawing Sheets

CONNECTOR WITH INTEGRAL FUSE HOLDER

TECHNICAL FIELD

The present disclosure relates generally to an electrical connector and more particularly to systems, methods, and devices for an electrical connector with an integral fuse holder.

BACKGROUND

Electrical connectors use used in a number of different electrical applications. For example, electrical connectors are used in photovoltaic (PV) solar applications to electrically couple a PV solar panel to a solar collector. In such a case, an electrical connector can be used for one or more of a variety of purposes, including but are not limited to protective schemes, signal control, signal delivery, power supply, and power regulation.

In a PV solar application, signals (e.g., current, voltage) from a number of solar panels are fed individually into a single collector. Often, the collector includes a junction box or similar components. The collector integrates all of the individual signals from each of the solar panels into a single signal. Further, one or more protection schemes (e.g., ground fault, overcurrent) can be integrated into such a circuit. Because of the number of connections required for such a circuit, installation can require a number of additional components (e.g., conduit, junction boxes) and/or steps (e.g., crimping conductors to conductor terminals) that add to the cost of installation, the time to install, the difficulty of installing, and the difficulty in maintaining and troubleshooting.

SUMMARY

In general, in one aspect, the disclosure relates to an integral connector end. The integral connector end can include a top portion having a connector coupling portion and an electrical connection feature, where the electrical connection feature has an electrically conductive material. The integral connector end can also include a middle portion having a first wall that surrounds a first cavity and a fuse receiver disposed within the first cavity, where the fuse receiver is electrically coupled to the electrical connection feature. The integral connector end can further include a bottom portion moveably coupled to the middle portion, where the bottom portion includes a second wall that forms a second cavity through which a fuse and a conductor traverse. The connector coupling portion, the first wall, and the second wall can be made of electrically non-conductive material.

In another aspect, the disclosure can generally relate to a photovoltaic (PV) solar panel connector assembly. The PV solar panel connector assembly can include a first connector portion, a second connector portion, a fuse assembly, and a conductor. The first connector portion of the PV solar panel connector assembly can include a first connector coupling portion and a first electrical connection feature. The second connector portion of the PV solar panel connector assembly can be mechanically coupled to the first connector portion. The second connector portion can include a top portion having a second connector coupling portion and a second electrical connection feature, where the second electrical connection feature includes an electrically conductive material. The second connector portion can also include a middle portion having a first wall that surrounds a first cavity and a fuse receiver disposed within the first cavity, where the fuse receiver is electrically coupled to the electrical connection feature. The second connector portion can further include a bottom portion moveably coupled to the middle portion, where the bottom portion includes a second wall that forms a second cavity, and where the connector coupling portion, the first wall, and the second wall are made of electrically non-conductive material. The fuse assembly can be electrically coupled to the fuse receiver after being inserted through the second cavity. The fuse assembly can include a fuse having a top end and a bottom end, where the top end and the bottom end each include an electrically conductive material. The fuse assembly can also include a fuse holder having a first end comprising electrically conductive material, where the first end is electrically coupled to the bottom end of the fuse. The fuse assembly can further include a conductor receiver electrically coupled to the first end of the fuse holder and to the bottom end of the fuse, where the conductor receiver includes a receiving feature. The conductor can be electrically and mechanically coupled to the conductor receiver.

These and other aspects, objects, features, and embodiments will be apparent from the following description and the appended claims.

BRIEF DESCRIPTION OF THE DRAWINGS

The drawings illustrate only exemplary embodiments and are therefore not to be considered limiting in scope, as the exemplary embodiments may admit to other equally effective embodiments. The elements and features shown in the drawings are not necessarily to scale, emphasis instead being placed upon clearly illustrating the principles of the exemplary embodiments. Additionally, certain dimensions or positionings may be exaggerated to help visually convey such principles. In the drawings, reference numerals designate like or corresponding, but not necessarily identical, elements.

DETAILED DESCRIPTION

In general, exemplary embodiments provide systems, methods, and devices for connectors with integral fuse holders. Specifically, exemplary embodiments provide for securing a conductor to a fuse and securing the fuse within a connector end. While the exemplary embodiments discussed herein are described with reference to a connector used in a collector system for PV solar panels, the exemplary connector can be used in one or more of a number of other electrical applications. Such other electrical applications can include, but are not limited to, motor control systems, protective relay systems, wind power systems, branch circuit management and protection, and generator control systems. Crimping of the fuse assembly to the conductor should be performed when the conductor and the fuse assembly are de-energized (i.e., have no current and/or voltage flowing therethrough).

With regard to a PV solar system, the exemplary connector with an integral fuse holder can be used to replace, or reduce the number of components of, a PV array circuit combiner. In other words, the connector with an integral fuse holder can replace one or more junction boxes, one or more terminal blocks, conduit, complicated wiring, additional crimping of wires, and/or other features used in conjunction with a PV array circuit combiner. Further, in certain exemplary embodiments, the connector with an integral fuse holder can be used to replace one or more circuits ancillary to the PV array circuit combiner. For example, the connector with an integral fuse holder can replace a fused switch or a circuit breaker panel.

Exemplary connectors with integral fuse holders can be used with electrical signals in the form of voltages and/or currents that are discrete and/or continuous, alternating current (AC) and/or direct current (DC), and provide for power and/or control. The electrical signals can flow from one or more of the multiple devices to the connector with integral fuse holder and/or in the opposite direction. The connector with integral fuse holder can have one or more of a number of applications. For example, the connector with an integral fuse holder can be used with PV solar panels. Other applications can include, but are not limited to, monitoring devices for a steam boiler, vibration monitors for an electric generator, and monitoring devices for an arc furnace.

A user may be any person that interacts with an exemplary connector with an integral fuse holder. Examples of a user may include, but are not limited to, an engineer, an electrician, an instrumentation and controls technician, a mechanic, an operator, a consultant, a contractor, and a manufacturer's representative.

In certain exemplary embodiments, a connector with an integral fuse holder (and/or an electrical device with which a connector with an integral fuse holder is integrated) is subject to meeting certain standards and/or requirements. For example, the National Electric Code (NEC) and the Institute of Electrical and Electronics Engineers (IEEE) set standards as to wiring and electrical connections. In PV solar applications, the NEC requires that PV solar panels be connected to a collector using a MC4 connector. The MC4 connector is described in more detail below with respect to FIGS. 1, 4, and 5.

In addition, Underwriters' Laboratories (UL) classifies fuse holders in a number of classes (e.g., Class J, Class T) where each class is defined by a number of categories, including but not limited to fuse characteristics (e.g., time delay, fast acting), interrupting rating (10,000 A, 200,000 A), and available ampere ratings (e.g., 1-1200, ¼-30). Use of exemplary embodiments described herein meet (and/or allow a corresponding device to meet) such standards when required.

Figure 1A:
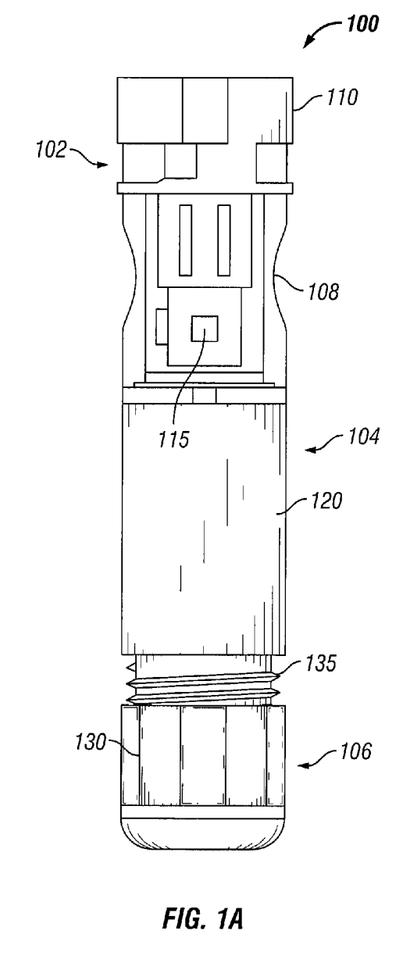
FIGS. 1A and 1B show various views of an integral connector end in accordance with certain exemplary embodiments.
Figure 1B:
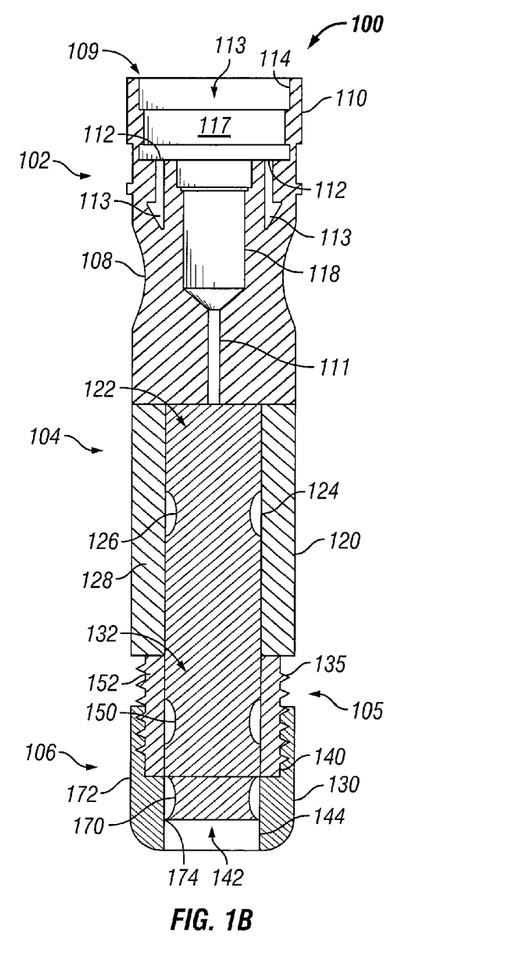

FIGS. 1A and 1B show a side view and a cross-sectional side view, respectively, of an integral connector end 100 in accordance with certain exemplary embodiments. In one or more embodiments, one or more of the components shown in FIGS. 1A and 1B may be omitted, repeated, and/or substituted. Accordingly, embodiments of an integral connector end should not be considered limited to the specific arrangements of components shown in FIGS. 1A and 1B.

Referring now to FIGS. 1A and 1B, the integral connector end 100 combines a fuse holder and an electrical connector. The integral connector end 100 includes a top portion 102, a middle portion 104, and a bottom portion 106. In certain exemplary embodiments, the integral connector end 100 is a combination fuse holder and electrical connector. The top portion 102 can include a connector coupling portion 109 that mechanically couples with a corresponding member (shown below with respect to FIG. 4) of the electrical connector. The connector coupling portion 109 of the electrical connector can be for any type of electrical connector. For example, the connector coupling portion 109 of the electrical connector can be a standard MC4 male interface.

The connector coupling portion 109 can include one or more of a number of coupling features to allow the top portion 102 to mechanically couple to the corresponding member of the electrical connector. Examples of such coupling features can include, but are not limited to, mating threads, slots, apertures, clamps, compressible bands, and compression fittings. As shown in FIG. 1B, the connector coupling portion 109 has two cavities 113 for receiving corresponding mating clips. The two cavities 113 are formed in the upper wall 114 of the connector coupling portion 109 at apertures 112. The two cavities 113 are shaped and sized in such a way as to secure the corresponding mating clips of the corresponding member of the electrical connector. In certain exemplary embodiments, a release mechanism is included with the connector coupling portion 109 to allow a user to mechanically uncouple the two portions of the electrical connector.

The connector coupling portion 109 has an outer surface 110 that forms the perimeter of the top portion 102. In certain exemplary embodiments, the outer surface 110 of the connector coupling portion 109 has an upper wall 114 disposed therein, forming a cavity 119. Within the cavity 119 is positioned an electrical connection feature 118. The electrical connection feature 118 is made, at least in part, of an electrically conductive material and is positioned within all or a portion of the cavity 113 of the top portion 102.

The electrical connection feature 118 can be positioned in such a way that a portion of the electrical connection feature 118 is accessible from the top side of the top portion 102. The electrical connection feature 118 can be sized (e.g., height, width, depth, cross-sectional shape) in such a way to mechanically couple to a corresponding electrical connection feature, as described below in FIG. 4. When the electrical connection feature 118 of the top portion 102 is mechanically coupled to the corresponding electrical connection feature, the two components are electrically coupled to allow voltage and/or current to flow therethrough. In this example, the electrical connection feature 118 is positioned below the upper wall 114 through an aperture 117 that is centered between the two cavities 113 of the connector coupling portion 109.

The electrical connection feature 118 can be configured as a male connector, a female connector, or a combination thereof. In certain exemplary embodiments, the electrical connection feature 118 is made of an electrically conductive material, including but not limited to copper and aluminum. The electrical connection feature 118 can have a smooth and/or textured surface. The shape and size of the electrical connection feature 118 is created to provide adequate electrical contact with the corresponding member of the electrical connector to avoid ground faults, overcurrent, overtemperature, and/or any other electrical operating conditions.

The outer surface 110 of the top portion 102 can be made of one or more of a number of electrically non-conductive materials to allow a user to contact the top portion 102 without the risk of electric shock. Examples of such electrically non-conductive materials can include, but are not limited to, plastic, rubber, nylon, and ceramic. In addition, in certain exemplary embodiments, the upper wall 114 of the connector coupling portion 109 is also made of one or more electrically non-conductive materials, which can be the same or a different electrically non-conductive material than the outer surface 110 of the top portion 102. In certain exemplary embodiments, the outer surface 110 includes one or more features 108 that allow a user to improve a grip on the top portion 102.

Examples of such a feature 108 can include, but are not limited to, a different texture of the outer surface 110, a concave curvature (as shown in FIGS. 1A and 1B) to the outer surface 110, and a convex curvature to the outer surface 110.

In certain exemplary embodiments, positioned underneath, and electrically coupled to, the electrical connection feature 118 is a bridge feature 111. The bridge feature 111 can be sized (e.g., height, width, depth, cross-sectional shape) in such a way to mechanically couple to a corresponding fuse connector, as described below with respect to FIG. 2. When the bridge feature 111 of the top portion 102 is mechanically coupled to the corresponding fuse connector, the two components are electrically coupled to allow voltage and/or current to flow therethrough. In this example, the bridge feature 111 is positioned below the bottom side of the electrical connection feature 118.

The bridge feature 111 can be configured as a male connector, a female connector, or a combination thereof. In certain exemplary embodiments, the bridge feature 111 is made of an electrically conductive material, including but not limited to copper and aluminum. The bridge feature 111 can have a smooth and/or textured surface. The shape and size of the bridge feature 111 is created to provide adequate electrical contact with the electrical connection feature 118 to avoid ground faults, overcurrent, overtemperature, and/or any other adverse electrical operating conditions. In certain exemplary embodiments, the bridge feature 111 is omitted or included as part of the middle portion 104 as opposed to the top portion 102.

Optionally, in certain exemplary embodiments, the outer surface 110 of the top portion 102 includes an indicating device 115. The indicating device 115 can provide a user with a visual indication of the operating state of the integral connector end 100. For example, the indicating device 115 can indicate that power is not flowing through the integral connector end 100. Such an indication can notify the user that the fuse has failed and should be replaced. In such a case, the indicating device 115 can illuminate in a color (e.g., red) different from the color illuminated by the indicating device 115 when the fuse is operating properly and power is flowing through the fuse. Alternatively, the indicating device 115 can fail to illuminate when the fuse has failed. As another example, the indicating device 115 can indicate that the fuse is operating properly, notifying the user that the circuit is live. In such a case, the indicating device 115 can illuminate in a green color.

The indicating device 115 can be a light source of any type, including but not limited to a light-emitting diode (LED), an incandescent bulb, and an organic LED. The indicating device 115 can be illuminated continuously or based on the occurrence of some event (e.g., passage of time, cycle time, fuse failure). The indicating device 115 can also vary in its level of illumination (brightness) and/or color of illumination based on the amount of power flowing through the integral connector end 100.

In addition, or alternatively, the indicating device 115 can emit some other type of notification about the status of power flow through the integral connector end 100. For example, the indicating device 115 can emit sound if no power is flowing through the integral connector end 100. Such a sound can have one or more of a number of volumes, be continuous or periodic, and/or have one or more of a number of noises.

The indicating device 115 can be powered by one or more of a number of sources. For example, the indicating device 115 can draw power from the power flowing through the electrically conductive portions of the integral connector end 110. In such a case a current transformer or similar device can be used to reduce the current and/or voltage to a level appropriate for use by the indicating device 115. As another example, a battery (not shown) can be used to power the indicating device 115 independent of the power flowing through the electrically conductive portions of the integral connector end 110.

The middle portion 104 of the integral connector end 100 includes an outer surface 120 of a wall 128 that forms a perimeter of the middle portion 104. In certain exemplary embodiments, the wall 128 of the middle portion 104 has an inner surface 124 that forms a cavity 122. The inner surface 124 forming the cavity 122 of the middle portion 104 can be called a fuse receiver 124. The fuse receiver 124 of the middle portion 104 can have a smooth and/or textured surface. The shape and size of the fuse receiver 124 is created to provide adequate mechanical contact with the outer surface of the fuse.

The middle portion 104 can be made of one or more of a number of electrically non-conductive materials. Examples of such electrically non-conductive materials can include, but are not limited to, plastic, rubber, nylon, and ceramic. In addition, or in the alternative, the fuse receiver 124 can be made of an electrically conductive material (e.g., copper, aluminum). Specifically, the top end of the fuse receiver 124 can be made of an electrically conductive material. In such a case, the top end of the fuse receiver 124 can be electrically and mechanically coupled to the bridge feature 111 and/or the electrical connection feature 118 of the top portion 102. In certain exemplary embodiments, the fuse receiver 124 is coupled to the bridge feature 111 and/or the electrical connection feature 118 when the bottom portion 106 is mechanically coupled to the middle portion 104.

In certain exemplary embodiments, one or more fastening features 126 are included in the middle portion 104. Each fastening feature 126 secures the fuse that is inserted into the cavity 122 of the middle portion 104. The fastening features 126 can be mechanically coupled to the inner surface 124, can be a texture of the inner surface 124, can be a different material of the inner surface 124, can use a compressive force to push against the outer surface of the fuse, can be some other feature, or can be any combination thereof. The fastening feature 126 can be made of an electrically non-conductive material. In certain exemplary embodiments, when the fastening feature 126 contacts an electrically conductive portion of the fuse when the fuse is inserted into the cavity 122, the fastening feature 126 is made of an electrically conductive material and is electrically coupled to the bridge feature 111 and/or the electrical connection feature 118 of the top portion 102.

The middle portion 104 can include a coupling feature 105. The coupling feature 105 allows the middle portion 104 to mechanically couple to the bottom portion 106 of the integral connector end 100. The coupling feature 105 includes a wall 152, which can have substantially the same cross-sectional dimensions as the cavity 122 of the rest of the middle portion 104. In certain exemplary embodiments, one or more fastening features 150 are included in the cavity 132 of the coupling feature 105. Each fastening feature 150 is substantially similar to the fastening feature 126 described above, except that the fastening feature 150 of the coupling feature 105 can be used to secure the conductor that is inserted into the cavity 132 of the coupling feature 105. In certain exemplary embodiments, the wall 152 is the same as the wall 128.

One or more coupling elements 135 can be disposed on and/or mechanically coupled to the wall 152. The coupling elements 135 mechanically couple to corresponding coupling elements 140 of the bottom portion 106. Examples of such coupling elements 135 can include, but are not limited to, mating threads (as shown in FIG. 1B), slots, fastening devices, receiving apertures, and clamps. In certain exemplary embodiments, the coupling elements 135 of the coupling feature 105 allow the middle portion 104 to be movably coupled to the bottom portion 106. Such movable coupling allows the bottom portion 106 to be loosened and/or detachable relative to the middle portion 104. In such a case, the fuse assembly (described below with respect to FIG. 2) can be removed from the integral connector end 100 and accessed.

The coupling feature 105 and the rest of the middle portion 104 can be made from a single piece (as from a mold). Alternatively, or in addition, the coupling feature 105 and the rest of the middle portion 104 can be separate pieces that are mechanically coupled to each other using one or more of a number of coupling methods, including but not limited to epoxy, compression fittings, heat fusion, and mating threads.

In certain exemplary embodiments, the bottom portion 106 of the integral connector end 100 is mechanically coupled to the middle portion 104. Specifically, the bottom portion 106 can be mechanically coupled to the coupling feature 105. The bottom portion 106 has a wall 172 having an inner surface 144 and an outer surface 130. The inner surface 144 of the wall 172 forms a cavity 142 through which the fuse assembly can traverse.

In certain exemplary embodiments, one or more sealing features 170 are included in the bottom portion 106. Each sealing feature 170 secures the conductor that is inserted into the cavity 142 of the bottom portion 106. The sealing features 170 can be mechanically coupled to the inner surface 144, can be a texture of the inner surface 144, can be a different material of the inner surface 144, can use a compressive force to push against the outer surface of the conductor, can be some other feature, or can be any combination thereof. The sealing feature 170 can be made of an electrically non-conductive material.

In addition to securing the conductor, the sealing feature 170 can create a seal against the conductor to prevent fluids from entering the cavity 142 when the bottom portion 106 is mechanically coupled to the middle portion 104. In such a case, the movable coupling between the bottom portion 106 and the middle portion 104 can cause the sealing feature 170 to constrict as the bottom portion 106 is coupled to the middle portion 104, and can cause the sealing feature 170 to retract as the bottom portion 106 is decoupled from the middle portion 104.

For example, as shown in FIG. 1B, the inner surface 144 of the second end 105 includes mating threads 135 that threadably couple to the mating threads 135 of the coupling feature 105. Positioned within the cavity 142 toward the bottom side of the second end 105 is a sealing feature 170. In this example, the sealing feature 170 is a compressible gland. The sealing feature 170 in this example is held in place within the cavity 142 by a collet 174 in the inner surface 144. As the bottom portion 106 and the middle portion 105 are threadably coupled together, the bottom end of the coupling feature 105 applies a compressive force against the sealing feature 170. Because the sealing feature 170 is held in place by the collet 174, the compressive force causes the feature 170 to expand inward toward the center of the cavity 142. Thus, when the conductor is inside the cavity 142, the sealing feature 170 tightens around the conductor, preventing (or reducing the amount of) fluid from entering into the cavity 122 of the middle portion 104.

The sealing feature 170 can be made from one or more of a number of materials, including but not limited to rubber, gel, and plastic. In addition, or in the alternative, other sealing features 170 can be used to secure the conductor and provide a seal around the conductor that keep elements (e.g., fluids, dust) from entering the cavity 122 of the middle portion 104. Other sealing features 170 can include, but are not limited to, a sliding barrier and a stackable barrier.

The outer surface 130 of the bottom portion 106 can include one or more features that help allow a user to couple and decouple the bottom portion 106 and the middle portion 104. Examples of such features can include, but are not limited to, beveled edges (for receiving a wrench to assist in rotating the bottom portion 106), a textured surface, and a gripping surface.

The outer surface 110 of the top portion 102, the wall 128 of the middle portion 104, and/or the wall 172 of the bottom portion 106 can be made from a single piece (as from a mold). Alternatively, or in addition, the outer surface 110 of the top portion 102, the wall 128 of the middle portion 104, and/or the wall 172 of the bottom portion 106 can be separate pieces that are mechanically coupled to each other using one or more of a number of coupling methods, including but not limited to epoxy, compression fittings, heat fusion, and mating threads.

Figure 2:
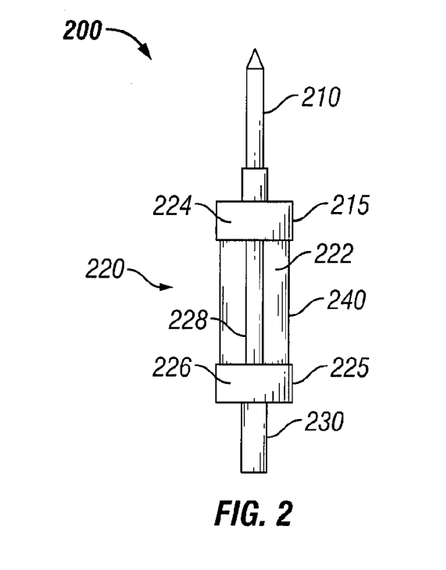
FIG. 2 shows a cross-sectional side view of a fuse assembly in accordance with certain exemplary embodiments.

FIG. 2 shows a cross-sectional side view of a fuse assembly 200 in accordance with certain exemplary embodiments. In one or more embodiments, one or more of the components shown in FIG. 2 may be omitted, repeated, and/or substituted. Accordingly, embodiments of a fuse assembly should not be considered limited to the specific arrangements of components shown in FIG. 2.

Referring now to FIGS. 1 and 2, the fuse assembly 200 is inserted into the bottom portion of the integral connector end 100. Specifically, the fuse assembly 200 is inserted through the cavity 142 of the bottom portion 106, through the cavity 132 of the coupling feature 105, and into the cavity 122 of the middle portion 104. The fuse assembly 200 includes a fuse 222, a fuse holder 220, a conductor receiver 230, and a contact member 210.

The fuse 222 is an electrical device that has two conductive ends 215, 225 (also called a top end 215 and a bottom end 225) that electrically couple to either side of a low resistance resistor 228 that traverses the inside of the fuse 222. The low resistance resistor 228 on the inside of the fuse 222 can be a metal wire or strip that melts when too much current flows therethrough. Under normal electric operating conditions, the fuse 222 allows power (e.g., voltage, current) to flow through it, from one end (e.g., the top end 215), through the resistor 228, and out the other end (e.g., the bottom end 225).

When the current and/or voltage flowing through the fuse 222 become too high (based, in part, on the rating and size of the fuse 222), the resistor 228 inside the fuse 222 breaks down (fails), creating an open circuit between the ends 215, 225 of the fuse 222. As such, the fuse 222 is a sacrificial device that provides overcurrent protection to a load source circuit. In other words, when the resistor 228 inside the fuse 222 melts, the circuit to which the fuse 222 is connected is interrupted. Excessive current can flow through the fuse 222 for one or more of a number of reasons, including but not limited to a short circuit, a current and/or voltage overload, a mismatched load, and a device failure. In order to reconnect the circuit through the fuse 222 once the fuse 222 has failed, the fuse 222 and/or the resistor 228 inside the fuse 222 is replaced. The resistor 228 inside the fuse 222 can be permanent or replaceable. Likewise, the entire fuse 222 can be permanent or replaceable.

The outer surface of the fuse 222 (between the top end 215 and the bottom end 225) is made of electrically non-conductive material. The outer surface of the fuse 222 can be made of one or more of a number of materials, including but not limited to ceramic, glass, plastic, fiberglass, molded mica laminates, and molded compressed fiber. The material used for the outer surface can depend on one or more of a number of factors, including but not limited to amperage rating, voltage class, and application.

The ends 215, 225 of the fuse 222 can be of the same or a different size and/or shape. The ends 215, 225 of the fuse 222 can have rounded ends, spade ends, wire leads, solder pads, and/or any other suitable shape. The fuse 222 can comply with one or more of a number of standards, including but not limited to International Electrotechnical Commission (IEC) standard 60269, NEC standard NFPA 70, and UL standard 248. Further, the fuse 222 can have a voltage and/or current rating, which represents the maximum voltage and/or current that the fuse 222 will allow to pass therethrough before failing, creating an open circuit. Examples of ratings that a fuse 222 can have include, but are not limited to, 1 A, 30 A, 600V, and 1000V.

In certain exemplary embodiments, the fuse holder 220 has a second end 224, a first end 226, and an intermediate portion 240. The second end 224 of the fuse holder 220 can be made of an electrically-conductive material and can be electrically and mechanically coupled to the top end 215 of the fuse 222 and to the contact member 210. The first end 226 of the fuse holder 220 can also be made of an electrically-conductive material (either the same or a different material than the second end 224) and can be electrically and mechanically coupled to the bottom end 225 of the fuse 222 and to the conductor receiver 230.

In certain exemplary embodiments, the fuse holder 220 has a second end 224 (also called a second end 224) and a first end 226 (also called a first end 226) that are shaped and sized to receive one or more fuses 222. The fuse holder 220 can be made from one or more of a number of materials, including metal (e.g., copper, alloy, aluminum, stainless steel), plastic, nylon, some other material, or any combination thereof. The ends 224, 226 of the fuse holder 220 can have some degree of physical flexibility (e.g., a clip) to allow the ends 215, 225 of the fuse 222 to be held under compression and/or tension and also to be removed by applying a certain amount of force to remove an end 215, 225 of the fuse 222 from the fuse holder 220. In such a case, the fuse 222 can be replaced (as when the fuse 222 fails) by a user.

The fuse holder 220 can also have an intermediate portion 240 that mechanically couples to each of the ends 215, 225 of the fuse holder 220. The intermediate portion 240 can be made of the same or a different material than the material used for the ends 215, 225 of the fuse holder 220. In certain exemplary embodiments, the intermediate portion 240 is made of an electrically non-conductive material.

The conductor receiver 230 (including the receiving feature) can be made of an electrically-conductive material. The receiving feature of the conductor receiver 230 is located at the distal end of the conductor receiver 230 and mechanically and electrically couples to a conductive portion of the conductor, described below with respect to FIG. 3. At the proximal end, the conductor receiver 230 is electrically and mechanically coupled to the first end 226 of the fuse holder 220. Consequently, the conductor receiver 230 is also electrically coupled to the bottom end 225 of the fuse 222.

The receiving feature of the conductor receiver 230 can be one or more of a number of features that allow the conductor receiver 230 to be fixedly and/or removably coupled to the conductor. For example, as shown in FIG. 2, the receiving feature of the conductor receiver 230 is a tube that has a size (e.g., cross-sectional shape, perimeter, diameter) sufficient to receive at least a conductive portion of the conductor. In such a case, the receiving feature can be made of a malleable surface that can be crimped or otherwise manipulated to fixedly couple to the conductor (and, thus, the first end 226 of the fuse holder 220 and the bottom end 225 of the fuse 222). If the conductor receiver 230 is a fuse clip, then the tube can be part of the fuse clip.

Other examples of a receiving feature for the conductor receiver 230 can include, but are not limited to, a compression fitting, an aperture, a fastening device, and a number of spikes (or similar protruding devices) that can puncture the insulation of the conductor and make mechanical contact with the conductive portion of the conductor. There can be a single receiving feature for a single conductor receiver 230. Alternatively, there can be multiple receiving features for a single conductor receiver 230.

The contact member 210 can be made of an electrically-conductive material. The contact member 210 is mechanically (e.g., fixedly, removably, threadably) coupled to the second end 224 of the fuse holder 220. Further, when the fuse assembly 200 is inserted into the integral connector end 100, the contact member 210 mechanically couples to the electrical connection feature 118 and/or the bridge feature 111. In such a case, the contact member 210 is also electrically coupled to the electrical connection feature 118 and/or the bridge feature 111. In certain exemplary embodiments, the feature (e.g., the electrical connection feature 118, the bridge feature 111) that actually receives and mechanically couples to the contact member 210 can also be called a contact member receiver or a fuse receiver.

The contact member 210 can have a shape and/or size to provide for enough physical contact with the electrical connection feature 118 and/or the bridge feature 111 so that the transfer of power between the contact member 210 and the electrical connection feature 118 or the bridge feature 111 avoids ground faults, overcurrent, overtemperature, and/or any other adverse electrical operating conditions. For example, as shown in FIGS. 1B and 2, the contact member 210 is a pin, and the bridge feature 111 has a cavity that has approximately the same dimensions as the pin. As a result, when the fuse assembly 200 is inserted into the integral connector end 100, the pin mechanically couples to the bridge feature 111.

In certain exemplary embodiments, the contact member receiver (e.g., the electrical connection feature 118, the bridge feature 111) includes one or more securing features (not shown). A securing feature can be any feature that holds the contact member 210 in place when the fuse assembly 200 is inserted into the integral connector end 100. Examples of a securing feature can include, but are not limited to, slight protrusions (e.g., bumps) along the inner surface of the contact member receiver that complement a corresponding protrusion along the outer surface of the contact member 210, a notch and a slot disposed on the contact member receiver and the contact member 210, and mating threads.

In certain exemplary embodiments, the contact member 210 and the second end 224 of the fuse holder 220 are integrated with the bridge feature 111 and/or the electrical connection feature 118. In such a case, the intermediate portion 240 of the fuse holder 220 can be omitted. When the resulting fuse assembly 200 is inserted into the cavity 122 of the middle portion 104, the top end 215 of the fuse is exposed and is mechanically coupled to a receiving feature (e.g., the bridge feature 111, the electrical connection feature 118) at the top of the cavity 122 to create the electrical connection.

Figure 3:
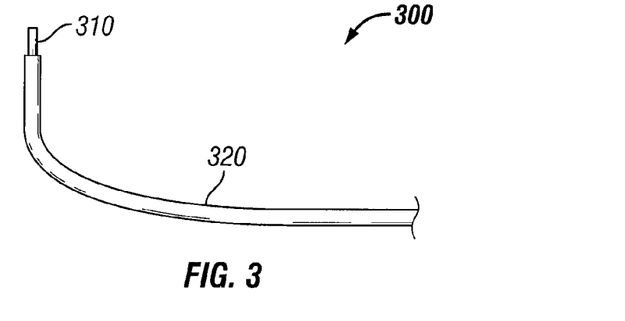
FIG. 3 shows a side view of a conductor in accordance with certain exemplary embodiments.

FIG. 3 shows an exemplary conductor 300 in accordance with certain exemplary embodiments. In one or more embodiments, one or more of the components shown in FIG.

3 may be omitted, repeated, and/or substituted. Accordingly, embodiments of a conductor should not be considered limited to the specific arrangements of components shown in FIG. 3.

Referring now to FIGS. 1-3, the conductor 300 can include an electrically conductive portion 310 and an insulating (electrically non-conductive) portion 320. The electrically conductive portion 310 can be made of one ore more electrically conductive materials (e.g., copper, aluminum) that can carry power (e.g., current, voltage). The amount of current and/or voltage that a conductor 300 can carry depends on one or more of a number of factors, including but not limited to the size (e.g., the cross-sectional area) of the conductive portion 310 of the conductor 300, the material of the conductive portion 310 of the conductor 300, and the ambient temperature. The size of the conductive portion 310 of the conductor 300 can be categorized in terms of American wire gauge (AWG) and/or any other standard. For example, the size of the conductor 300 (or more specifically the conductive portion 310 of the conductor 300) can be between, and inclusive of, 12 AWG and 8 AWG. The conductive portion 310 can be a solid material, a number of solid materials bundled together, a meshed material, or material arranged in any other suitable configuration.

The insulating portion 320 of the conductor 300 encases one or more conductive portions 310 of the conductor 300. The insulating portion 320 of the conductor 300 can be made of one or more electrically non-conductive materials (e.g., rubber, nylon, plastic). In certain exemplary embodiments, the insulating portion 320 can be removed in portions using a tool (e.g., a wire stripper, a knife) so that the conductive portion 310 is exposed. In such a case, the conductive portion 310 that is exposed can be mechanically and electrically coupled to the conductor receiver 230.

The conductor 300 can be a single conductive portion 310 encased in a single insulating portion 320. Alternatively, the conductor 300 can be multiple conductive portions 310 encased in a single insulating portion 320. In yet another embodiment, the conductor can be a single conductive portion 310 encased in multiple insulating portions 320. Alternatively, the conductor 300 can be multiple conductive portions 310 encased in multiple insulating portions 320, as in a multi-conductor cable. The other end of the conductor 300 can continue on to another device in an electrical system. For example, for a PV solar system, the other end of the conductor 300 can couple to a PV solar panel or a collector.

Referring to FIGS. 1-4, FIG. 4 shows a side view of a connector 400 that mechanically couples to the integral connector end 100 in accordance with certain exemplary embodiments. In certain exemplary embodiments, the connector 400 is a complementary connector portion relative to the top portion 102 of the integral connector end 100. Specifically, the connector 400 has one or more features (e.g., electrical connection feature 410, mating clips 420) that mechanically and/or electrically couples with the top portion 102. In this example, the mating clips 420 can be inserted into and coupled with the two cavities 113 formed in the upper wall 114 of the connector coupling portion 109 at apertures 112. In addition, the electrical connection feature 410 (e.g., a pin) can be inserted into and coupled with the electrical connection feature 118 of the top portion 102.

Figure 4:
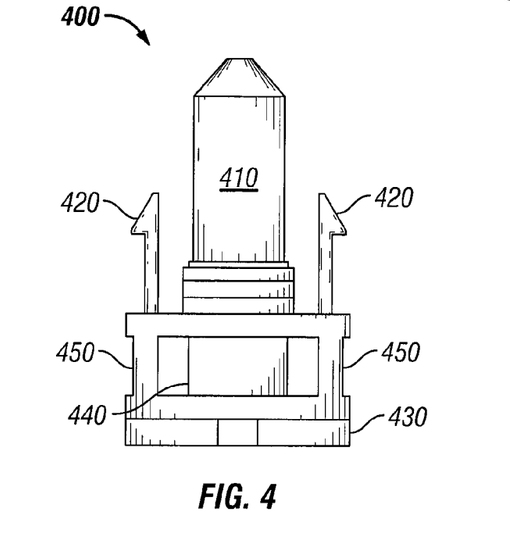
FIG. 4 shows a side view of a connector that mechanically couples to the integral connector end in accordance with certain exemplary embodiments.

When the connector 400 is mechanically coupled to the top portion 102 of the integral connector end 100, the two components are also electrically coupled to each other, allowing power to flow through the two components. The connector 400 can be for any type of electrical connector. For example, if the connector coupling portion 109 of the electrical connector is a standard MC4 male interface, then the connector 400 can be a standard MC4 female interface.

To decouple the connector 400 from the top portion 102 of the integral connector end 100, a release mechanism can be exercised on the connector 400 and/or the top portion 102. For example, the compressible sides 450 of the connector 400 can be depressed by a user by applying an inward force at both ends of the compressible sides 450. When enough inward force is applied, the mating clips 420 move inside the two cavities 113 of the connector coupling portion 109. In such a case, if an outward force (pulling the connector 400 and the top portion 102 in opposite directions) is applied while the inward force on the compressible sides 450 is maintained, then the connector 400 can be decoupled from the top portion 102. When the connector 400 and the top portion 102 are decoupled, the components are also electrically decoupled.

Figure 5:
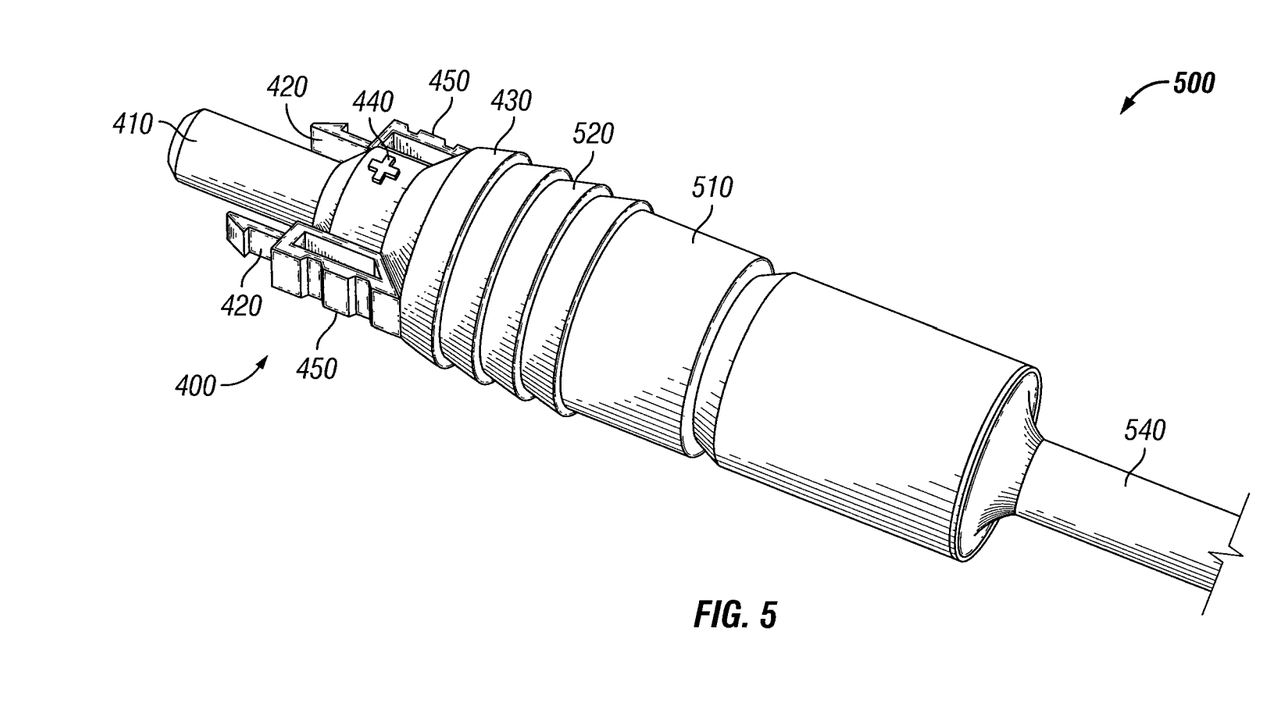
FIG. 5 shows a perspective view of a connector assembly that includes the connector of FIG. 4, in accordance with certain exemplary embodiments.

FIG. 5 shows a perspective view of a connector assembly 500 that includes the connector 400 of FIG. 4, in accordance with certain exemplary embodiments. Specifically, the connector assembly 500 includes a body 510 that is mechanically coupled to the connector 400 using a connecting collar 520. The other end of the body 510 has a conductor 540 traversing therethrough. The conductor 540 can continue on to another device in an electrical system. For example, for a PV solar system, the other end of the conductor 540 can couple to a PV solar panel or a collector.

Exemplary embodiments provide for an improved connector that integrates a fuse. Specifically, a user (e.g., electrician) can couple a conductor to a fuse assembly using only a single action (e.g., crimping a conductor receiver of the fuse assembly to mechanically and electrically couple the conductor receiver to the conductive portion of the conductor). The user can then insert the fuse assembly into the connector body and manually tighten an end piece of the connector body to secure the conductor and fuse assembly and to prevent elements (e.g., moisture, dirt) external to the connector body from entering a cavity of the connector body. Certain exemplary embodiments allow a user to assemble the conductor, fuse assembly, and connector body without the use of (or with limited use of) tools. Further, exemplary embodiments can provide a user with a visual indication that a fuse is securely received into the connector body. Exemplary embodiments may be used with a number of sizes and/or shapes of conductor and/or fuses.

Further, exemplary embodiments save time, material, and money in installing and maintaining an electrical system. Specifically, using exemplary connectors with integral fuse holders described herein can reduce or eliminate the need for junction boxes, conduit, terminal blocks, fuse blocks, conductors, and a number of other components. In addition, the use of exemplary connectors with integral fuse holders can provide one or more of a number of electrical and/or mechanical benefits relative to the conductor. Such benefits can include, but are not limited to, strain relief, ease of installation, ease of maintenance, timeliness of replacing a blown fuse that results from an overcurrent and/or overtemperature condition, and visual confirmation of connectivity of the connector with integral fuse holder.

Although embodiments described herein are made with reference to exemplary embodiments, it should be appreciated by those skilled in the art that various modifications are well within the scope and spirit of this disclosure. Those skilled in the art will appreciate that the exemplary embodiments described herein are not limited to any specifically discussed application and that the embodiments described herein are illustrative and not restrictive. From the description of the exemplary embodiments, equivalents of the elements shown therein will suggest themselves to those skilled in the art, and ways of constructing other embodiments using the present disclosure will suggest themselves to practitioners of the art. Therefore, the scope of the exemplary embodiments is not limited herein.

What is claimed is:

1. An integral connector end, comprising:
a first piece comprising:
   a top portion comprising a connector coupling portion and an electrical connection feature, wherein the electrical connection feature comprises an electrically conductive material, wherein the connector coupling portion and the electrical connection feature are located toward a first end of the first piece; and
   a middle portion comprising a first wall that surrounds a first cavity and a fuse receiver disposed within the first cavity, wherein the fuse receiver is electrically coupled to the electrical connection feature, wherein the first wall has disposed thereon at least one coupling feature, and wherein the at least one coupling feature is located toward a second end of the first piece, wherein the second end is opposite the first end; and
a second piece comprising a bottom portion removeably coupled to the middle portion of the first piece, wherein the bottom portion comprises a second wall that forms a second cavity through which an end of a fuse and a conductor traverse, wherein the second wall has disposed thereon at least one complementary coupling feature that couples to the at least one coupling feature of the middle portion,
wherein the connector coupling portion, the first wall, and the second wall are made of electrically non-conductive material.

2. The integral connector end of claim 1, wherein the bottom portion further comprises a sealing feature disposed within the second cavity, wherein the sealing feature prevents fluids from entering the first cavity when the bottom portion is coupled to the middle portion.

3. The integral connector end receiver of claim 2, wherein the bottom portion is threadably coupled to the middle portion, and wherein the sealing feature tightens around the conductor as the bottom portion is tightened to the middle portion.

4. The integral connector end of claim 1, wherein the fuse receiver comprises a securing feature that maintains mechanical and electrical contact with a top end of the fuse when the bottom portion is mechanically coupled to the middle portion.

5. The integral connector end of claim 1, wherein the conductor is mechanically coupled to a bottom end of the fuse using a conductor receiver.

6. The integral connector end of claim 1, wherein the top portion further comprises a bridge feature the electrically couples the electrical connection feature of the top portion to the fuse receiver of the middle portion.

7. The integral connector end of claim 1, wherein the middle portion further comprises a bridge feature that electrically couples the electrical connection feature of the top portion to the fuse receiver of the middle portion.

8. A photovoltaic (PV) solar panel connector assembly, comprising:
a first connector portion comprising a first connector coupling portion and a first electrical connection feature;
a second connector portion that mechanically couples to the first connector portion, wherein the second connector portion comprises:
   a top portion comprising a second connector coupling portion and a second electrical connection feature, wherein the second electrical connection feature comprises an electrically conductive material and wherein the second connector coupling portion couples to the first connector coupling portion, and wherein the second connector coupling portion and the second electrical connection feature are located toward a first end of the second connector portion; and
   a middle portion comprising a first wall that surrounds a first cavity, a third connector coupling portion, and a fuse receiver disposed within the first cavity, wherein the fuse receiver is electrically coupled to the electrical connection feature, wherein the third connector coupling portion is located toward a second end of the second connector portion, wherein the second end is opposite the first end;
a third connector portion comprising a bottom portion removeably coupled to the middle portion of the second connector portion, wherein the bottom portion comprises a second wall that forms a second cavity and a fourth connector coupling portion, wherein the fourth connector coupling portion is coupled to the third connector coupling portion, wherein the connector coupling portion, the first wall, and the second wall are made of electrically non-conductive material;
a fuse assembly electrically coupled to the fuse receiver after being inserted through the second cavity, wherein the fuse assembly comprises:
   a fuse having a top end and a bottom end, wherein the top end and the bottom end each comprise an electrically conductive material, and wherein the fuse has a first end disposed in the second cavity of the bottom portion and a remainder disposed within the first cavity of the middle portion of the second connector portion;
   a fuse holder comprising a first end comprising electrically conductive material, wherein the first end is electrically coupled to the bottom end of the fuse; and
   a conductor receiver electrically coupled to the first end of the fuse holder and to the bottom end of the fuse, wherein the conductor receiver comprises a receiving feature; and
a conductor electrically and mechanically coupled to the conductor receiver.

9. The PV solar panel connector assembly of claim 8, wherein the fuse holder further comprises a second end that mechanically couples to the top end of the fuse and the fuse receiver.

10. The PV solar panel connector assembly of claim 9, wherein the fuse assembly further comprises a contact member that mechanically couples to the second end of the fuse holder and to the fuse receiver.

11. The PV solar panel connector assembly of claim 9, wherein the fuse holder further comprises an intermediate portion mechanically couples to the first end and the second of the fuse holder, wherein the intermediate portion comprises an electrically non-conductive material.

12. The PV solar panel connector assembly of claim 8, wherein the conductor receiver is a tube that is crimped to mechanically couple the tube to the conductor and to electrically couple the conductor to the bottom end of the fuse.

13. The PV solar panel connector assembly of claim 8, wherein the contact member of the fuse assembly is a pin that mechanically couples to a securing feature of the fuse receiver.

14. The PV solar panel connector assembly of claim 8, wherein the second connector portion further comprises an indicating device, wherein the indicating device notifies a user that the fuse has failed.

15. The PV solar panel connector assembly of claim 8, wherein the second connector portion is a type MC4 male interface.

16. The PV solar panel connector assembly of claim 8, wherein the fuse is rated for between 1 A and 30 A and between 600V and 1000V.

17. The PV solar panel connector assembly of claim 8, wherein the bottom portion further comprises a sealing feature disposed within the second cavity, wherein the sealing feature prevents fluids from entering the first cavity when the bottom portion is coupled to the middle portion.

18. The PV solar panel connector assembly of claim 8, wherein the conductor has a size between 12 American wire gauge (AWG) and 8 AWG.

19. The PV solar panel connector assembly of claim 8, wherein the first end and the second end of the fuse holder is a pair of electrically conductive fuse clips for mechanically coupling to the top end and the bottom end, respectively, of the fuse.

20. The PV solar panel connector assembly of claim 8, wherein the fuse can be removed and replaced when the fuse fails.

* * * * *